(12) United States Patent
Sugiura et al.

(10) Patent No.: US 10,043,853 B2
(45) Date of Patent: Aug. 7, 2018

(54) MAGNETIC MEMORY DEVICE

(71) Applicant: Toshiba Memory Corporation, Minato-ku, Tokyo (JP)

(72) Inventors: Kuniaki Sugiura, Seoul (KR); Masahiko Hasunuma, Seoul (KR); Masatoshi Yoshikawa, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/463,215

(22) Filed: Mar. 20, 2017

(65) Prior Publication Data
US 2018/0076263 A1    Mar. 15, 2018

Related U.S. Application Data

(60) Provisional application No. 62/395,291, filed on Sep. 15, 2016.

(51) Int. Cl.
*H01L 27/22* (2006.01)
*H01L 29/78* (2006.01)
(Continued)

(52) U.S. Cl.
CPC .......... *H01L 27/228* (2013.01); *H01L 43/02* (2013.01); *H01L 43/08* (2013.01)

(58) Field of Classification Search
CPC ........ H01L 27/228; H01L 43/02; H01L 43/08
See application file for complete search history.

(56) References Cited

U.S. PATENT DOCUMENTS

| 8,829,580 B2 | 9/2014 | Sugiura et al. |
| 2014/0038385 A1* | 2/2014 | Lee .................. H01L 21/76224 438/424 |

(Continued)

FOREIGN PATENT DOCUMENTS

| JP | 5010650 B2 | 8/2012 |
| JP | 2012204431 A | 10/2012 |
| JP | 2013201343 A | 10/2013 |

OTHER PUBLICATIONS

Kuniaki Sugiura, et al., "Ion Beam Etching Technology for High-Density Spin Transfer Torque Magnetic Random Access Memory", Japanese Journal of Applied Physics, vol. 48, No. 8S1, Aug. 20, 2009, pp. 08HD02-1 to 08HD02-3.

(Continued)

*Primary Examiner* — Su C Kim
*Assistant Examiner* — David S Wilbert
(74) *Attorney, Agent, or Firm* — Holtz, Holtz & Volek PC

(57) ABSTRACT

According to one embodiment, a magnetic memory device includes a first insulating film provided on a semiconductor region, and having a portion located in a memory cell array area and thicker than a portion located in a peripheral circuit area, a plurality of conductive plugs located in the memory cell array area and provided in the first insulating film, stacked structures located in the memory cell array area, provided on the conductive plugs, and each having layers including a magnetic layer, and transistors located in the peripheral circuit area, and each including a gate electrode provided on the semiconductor region and covered with the first insulating film, wherein a thickness t0 from a main surface of the semiconductor region to a lower surface of each stacked structure is greater than a predetermined value.

20 Claims, 7 Drawing Sheets

(51) Int. Cl.
  *H01L 43/08*    (2006.01)
  *H01L 43/02*    (2006.01)

(56) References Cited

U.S. PATENT DOCUMENTS

2014/0042508 A1*  2/2014  Lee ................... H01L 27/228
                                              257/295
2014/0252438 A1*  9/2014  Shukh ................ G11C 11/1675
                                              257/295

OTHER PUBLICATIONS

MicroFab, "Ion Beam Etch Rates," downloaded Feb. 27, 2017, http://www.microfabnh.com/ion_beam_etch_rates.php.

* cited by examiner

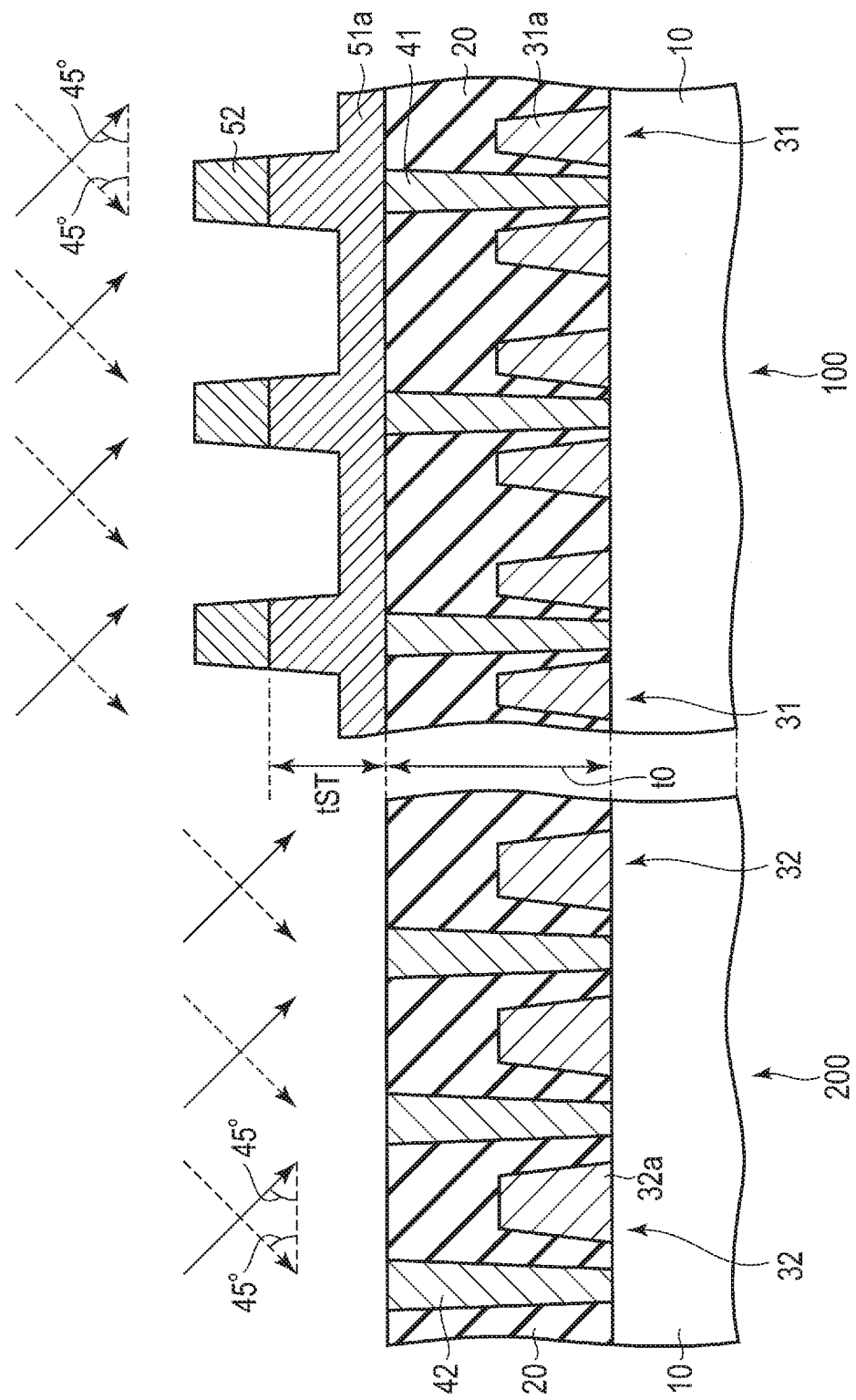
F I G. 5

MAGNETIC MEMORY DEVICE

CROSS-REFERENCE TO RELATED APPLICATIONS

This application claims the benefit of U.S. Provisional Application No. 62/395,291, filed Sep. 15, 2016, the entire contents of which are incorporated herein by reference.

FIELD

Embodiments described herein relate generally to a magnetic memory device.

BACKGROUND

A magnetic memory device (semiconductor integrated circuit device) in which magnetoresistive elements and MOS transistors are integrated on a semiconductor substrate has been proposed.

However, since microfabrication of elements has been developed to thereby increase the degree of integration of elements, it has been difficult to obtain a magnetic memory device having a desired structure.

In view of this, it is important to set accurate conditions for obtaining the magnetic memory device having the desired structure.

BRIEF DESCRIPTION OF THE DRAWINGS

FIG. 5 is another schematic cross-sectional view showing another part of the process of manufacturing the magnetic memory device of the embodiment.

DETAILED DESCRIPTION

In general, according to one embodiment, a magnetic memory device includes: a semiconductor region; a first insulating film located in a memory cell array area and a peripheral circuit area, provided on the semiconductor region, and having a portion located in the memory cell array area and thicker than a portion located in the peripheral circuit area; a plurality of conductive plugs located in the memory cell array area and provided in the first insulating film; a plurality of stacked structures located in the memory cell array area, provided on the conductive plugs, and each having a plurality of layers including a magnetic layer; a second insulating film provided on the first insulating film and covering the stacked structures; and a plurality of transistors located in the peripheral circuit area, and each including a gate electrode provided on the semiconductor region and covered with the first insulating film, wherein the following relationship is satisfied:

$$t0 > hgate + tST*(0.48 - 0.086*sST/hST)$$

where t0 is a thickness from a main surface of the semiconductor region to a lower surface of each of the stacked structures, hgate is a height of the gate electrode from the main surface of the semiconductor region, tST is a thickness from the lower surface of each of the stacked structures to a lower surface of an uppermost layer of each of the stacked structures, hST is a height from an interface between the first and second insulating films to an upper surface of the uppermost layer of each of the stacked structures, and sST is a space width between adjacent ones of the stacked structures adjacent in a predetermined direction.

An embodiment will hereinafter be described with reference to the accompanying drawings.

Figure 1:
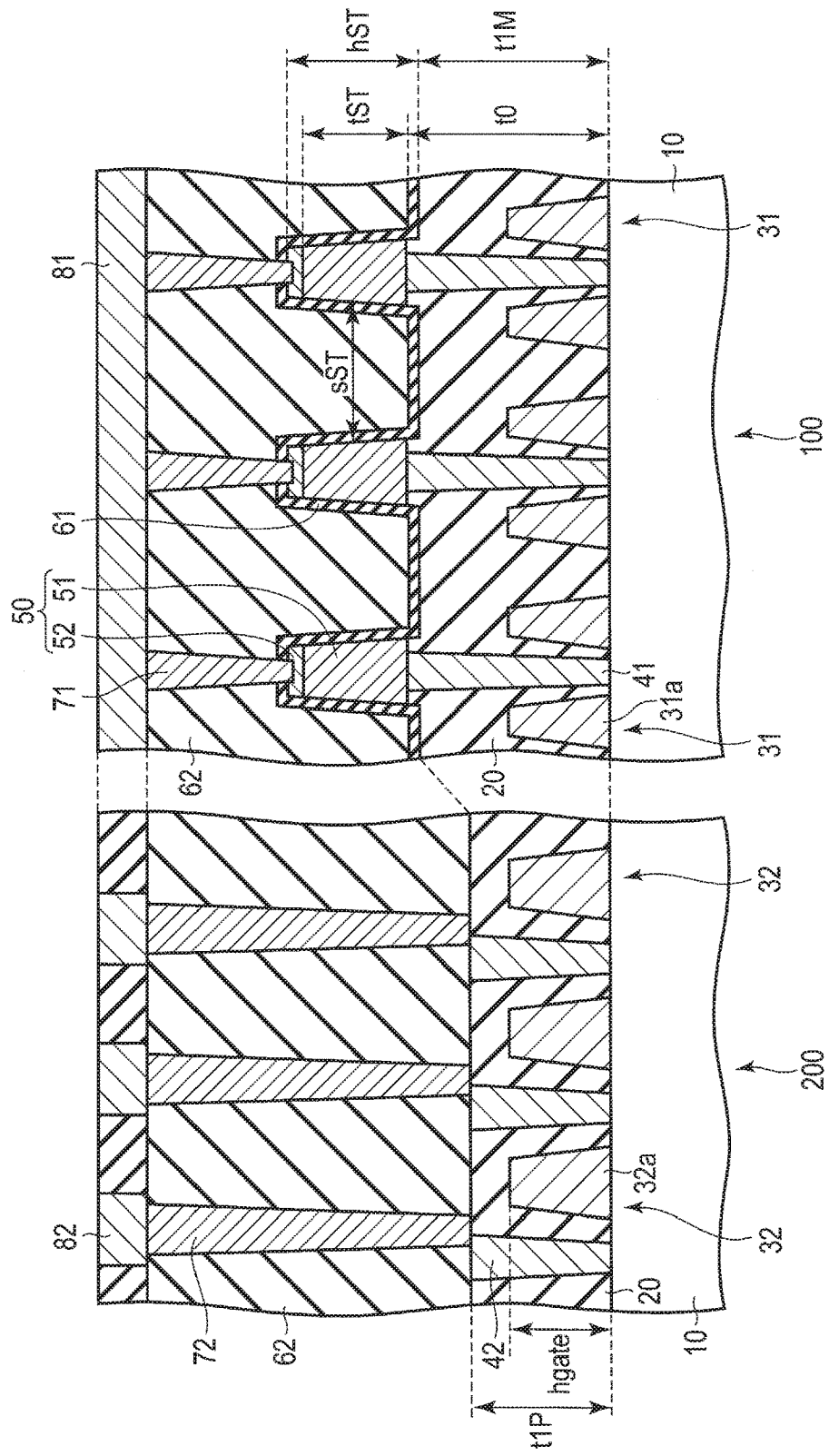
FIG. 1 is a schematic cross-sectional view showing the structure of a magnetic memory device according to an embodiment.

FIG. 1 is a schematic cross-sectional view showing the structure of a magnetic memory device (semiconductor integrated circuit device) according to the embodiment.

As shown in FIG. 1, the magnetic memory device according to the embodiment comprises a memory cell array area 100 and a peripheral circuit area 200. In the memory cell array area 100, a plurality of memory cells are arranged in a matrix. Each memory cell includes a magnetoresistive element, and a select transistor for selecting the magnetoresistive element. The magnetoresistive element is also called an MTJ (magnetic tunnel junction) element. The peripheral circuit area 200 includes a write circuit, a read circuit, etc., associated with each memory cell in the memory cell array area 100.

Figure 2:
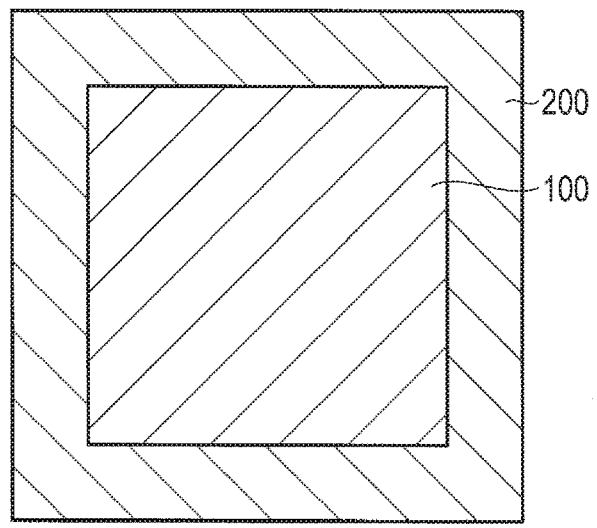
FIG. 2 is a schematic plan view showing the arrangement of a memory cell array area and a peripheral circuit area in the magnetic memory device of the embodiment.

FIG. 2 is a schematic plan view showing the arrangement of the memory cell array area 100 and the peripheral circuit area 200. As shown in FIG. 2, the peripheral circuit area 200 is provided outside and adjacent to the memory cell array area 100. In the example shown in FIG. 2, the memory cell array area 100 is surrounded by the peripheral circuit area 200.

In FIG. 1, an interlayer insulating film (first insulating film) 20 is provided on a semiconductor substrate 10. The interlayer insulating film 20 is located in the memory cell array area 100 and the peripheral circuit area 200. More specifically, the interlayer insulating film 20 is continuously formed in the memory cell array area 100 and the peripheral circuit area 200. The interlayer insulating film 20 is thicker in the memory cell array area 100 than in the peripheral circuit area 200. The interlayer insulating film 20 is formed of a silicon oxide layer.

On the semiconductor substrate 10 in the memory cell array area 100, a plurality of MOS transistors 31 are provided. The MOS transistors 31 function as select transistors for selecting respective magnetoresistive elements described later. The gate electrode 31a of each MOS transistor 31 is covered with the interlayer insulating film 20.

Conductive plugs (contact plugs) 41 are provided in the interlayer insulating film 20 of the memory cell array area 100. One end of a respective conductive plug 41 is connected to the source/drain portion of a corresponding MOS transistor 31, and the other end of the respective conductive plug 41 is connected to a magnetoresistive element described later. The conductive plugs 41 function as bottom electrodes of magnetoresistive elements.

On the semiconductor substrate 10 in the peripheral circuit area 200, a plurality of MOS transistors 32 are formed. The MOS transistors 32 function as portions of the peripheral circuit. The gate electrode 32a of each MOS transistor 32 is covered with the interlayer insulating film 20.

Conductive plugs (contact plugs) 42 are provided in the interlayer insulating film 20 of the peripheral circuit area 200. One end of each conductive plug 42 is connected to the source/drain portion of a corresponding MOS transistor 32.

On the conductive plugs 41 in the memory cell array area 100, respective stacked structures 50 used as magnetoresistive elements are provided. Each stacked structure 50 includes a main body portion 51 of a corresponding magnetoresistive element, and a hard mask portion (hard mask layer) 52 provided on the main body portion 51. Each stacked structure 50 will be described later in detail.

On the interlayer insulating film (first insulating film) 20, a protective film (second insulating film) 61 is provided, covering the stacked structure 50. The protective film 61 is formed of a material different from the material of the interlayer insulating film 20. Specifically, the protective film 61 is formed of a silicon nitride layer.

An interlayer insulating film 62 is provided on the interlayer insulating film 20 in the memory cell array area 100 and the peripheral circuit area 200. Specifically, the interlayer insulating film 62 is continuously formed in the memory cell array area 100 and the peripheral circuit area 200. The interlayer insulating film 62 is formed of a silicon oxide layer.

The interlayer insulating film 62 of the memory cell array area 100 covers the protective film 61 and the stacked structures 50. Conductive plugs (contact plugs) 71 are provided in the interlayer insulating film 62 of the memory cell array area 100. An end of a respective conductive plug 71 is connected to a corresponding stacked structure 50. The other end of the respective conductive plug 71 is connected to an interconnect (bit line) 81. The conductive plugs 71 function as the top electrodes of the respective magnetoresistive elements.

Conductive plugs (contact plugs) 72 are provided in the interlayer insulating film 62 of the peripheral circuit area 200. One end of a respective conductive plug 72 is connected to a corresponding conductive plug 42, and the other end of the respective conductive plug 72 is connected to a corresponding interconnect 82.

Figure 3:
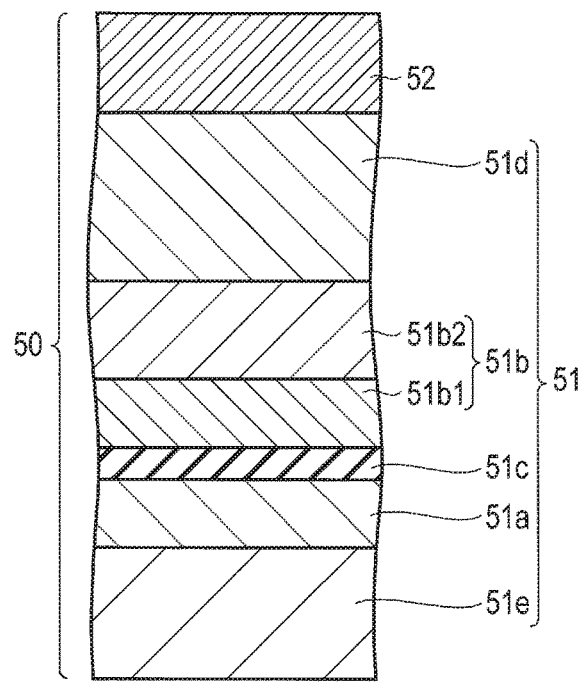
FIG. 3 is a schematic cross-sectional view showing the stacked structure of the magnetic memory device of the embodiment in detail.

FIG. 3 is a schematic cross-sectional view showing the stacked structure 50 in detail.

As shown in FIG. 3, the stacked structure 50 comprises the main body portion 51 of the magnetoresistive element, and a hard mask portion (hard mask layer) 52 provided on the main body portion 51. The main body portion 51 of the stacked structure 50 comprises a storage layer (first magnetic layer) 51a having a variable magnetization direction, a reference layer (second magnetic layer) 51b having a fixed magnetization direction, a tunnel barrier layer (nonmagnetic layer) 51c provided between the storage layer 51a and the reference layer 51b, a shift canceling layer 51d provided on the reference layer 51b and having a fixed magnetization direction that is antiparallel with the magnetization direction of the reference layer 51b, and an underlayer 51e provided on the lower surface of the storage layer 51a. The hard mask layer 52 as the uppermost layer of the stacked structure 50 is provided on the main body portion 51.

The storage layer (first magnetic layer) 51a is a ferromagnetic layer and contains iron (Fe) and boron (B). The storage layer 51a may contain cobalt (Co) in addition to iron (Fe) and boron (B). As the storage layer 51a, a CoFeB layer, for example, is used. Further, the storage layer 51a has a magnetization direction perpendicular to its main surface.

The reference layer (second magnetic layer) 51b is a ferromagnetic layer, and comprises a lower layer portion 51b1 and an upper portion 51b2. The lower layer portion 51b1 contains iron (Fe) and boron (B). In addition to iron (Fe) and boron (B), the lower layer portion 51b1 may contain cobalt (Co). As the lower layer portion 51b1, a CoFeB layer, for example, is used. The upper layer portion 51b2 contains cobalt (Co) and at least one element selected from a group of platinum (Pt), nickel (Ni) and palladium (Pd). As the upper layer portion 51b2, a CoPt layer, for example, is used. Moreover, the reference layer 51b has a magnetization direction perpendicular to its main surface.

The tunnel barrier layer (nonmagnetic layer) 51c is an insulating film, and contains magnesium (Mg) and oxygen (O). As the tunnel barrier layer 51c, an MgO layer, for example, is used.

The shift canceling layer 51d is a ferromagnetic layer, and contain cobalt (Co) and at least one element selected from a group of platinum (Pt), nickel (Ni) and palladium (Pd). As the shift canceling layer 51d, a CoPt layer, for example, is used. Moreover, the shift canceling layer 51d has a magnetization direction perpendicular to its main surface.

A metal nitride, a metal oxide, etc. is used for the underlayer 51e.

The hard mask layer (uppermost layer) 52 functions as a hard mask when the pattern of the main body portion 51 of the stacked structure 50 is formed. This hard mask layer 52 functions as a hard mask for IBE (ion beam etching). The hard mask layer 52 is formed of tungsten (W), tantalum (Ta), titanium nitride (TiN), etc.

The above-described stacked structure 50 functions as an STT (spin transfer torque) magnetoresistive element having perpendicular magnetization. Further, the resistance of the above-described stacked structure 50 (i.e., the resistance of the magnetoresistive element) is lower when the magnetization direction of the storage layer 51a is parallel with the magnetization direction of the reference layer 51b, than when the former is antiparallel with the latter. That is, the stacked structure 50 exhibits a low resistance state when the magnetization direction of the storage layer 51a is parallel with the magnetization direction of the reference layer 51b, and exhibits a high resistance state when the former is antiparallel with the latter. Accordingly, the magnetoresistive element can store binary data (0 or 1) in accordance with the resistance state (the low resistance state or the high resistance state). Moreover, the resistance state (the low resistance state and the high resistance state) of the magnetoresistive element can be set in accordance with the direction of a write current flowing through the magnetoresistive element (stacked structure 50).

The above-described magnetic memory device of the embodiment satisfies the following relationships:

$$t0 > hgate + tST*(0.48 - 0.086*sST/hST) \qquad (1)$$

$$t1M - t1P \geq tST*(0.48 - 0.086*sST/hST) \qquad (2)$$

where t0 is a thickness from the main surface of the semiconductor substrate 10 to the lower surface of the stacked structure 50, hgate is the height of the gate electrode 32a from the main surface of the semiconductor substrate 10, tST is a thickness from the lower surface of the stacked structure 50 to the lower surface of the uppermost layer (hard mask layer 52) of the stacked structure 50, hST is a thickness from the interface of the interlayer insulating film (first insulating film) 20 and the protective insulating film (second insulating film) 61 to the upper surface of the uppermost layer (hard mask layer 52) of the stacked structure 50, and sST is a space width between each pair of stacked structures 50 adjacent in a predetermined direction, sST/hST being lower than 5.58. Further, t1M is the thickness of a particular portion of the interlayer insulating film (first insulating film) 20 from the main surface of the semiconductor substrate 10 in the memory cell array area 100, the particular portion of the interlayer insulating film 20 is positioned below an area interposed between each pair of adjacent stacked structures 50, and t1P is the thickness of the interlayer insulating film (first insulating film) 20 from the main surface of the semiconductor substrate 10 in the peripheral circuit area 200.

Moreover, in the above-described magnetic memory device of the embodiment, sST/hST is preferably not less than 1.0.

A detailed description will now be given of the fact that the magnetic memory device of the embodiment satisfies the above-mentioned relationship.

Figure 4:
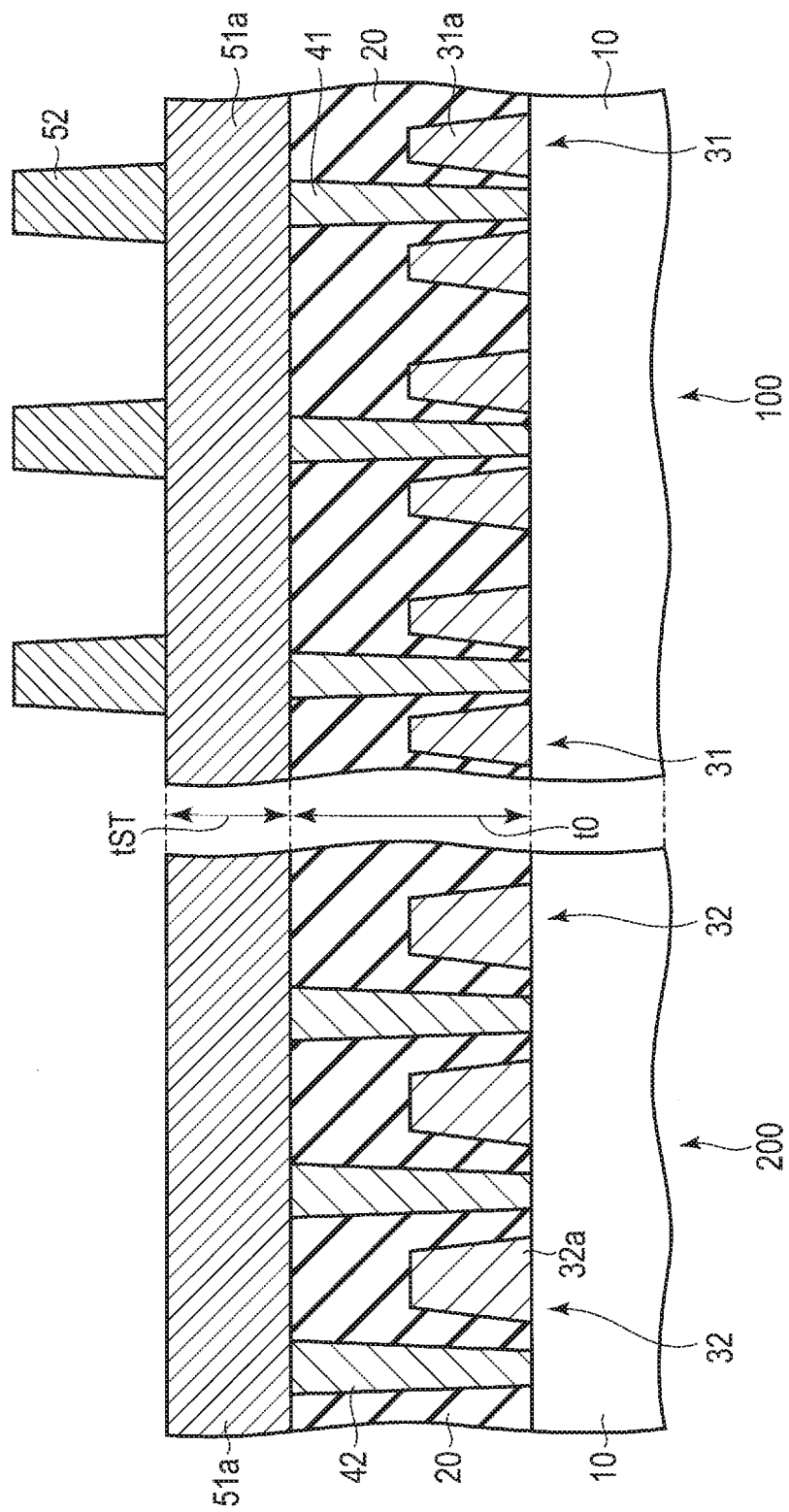
FIG. 4 is a schematic cross-sectional view showing a part of a process of manufacturing the magnetic memory device of the embodiment.
Figure 6:
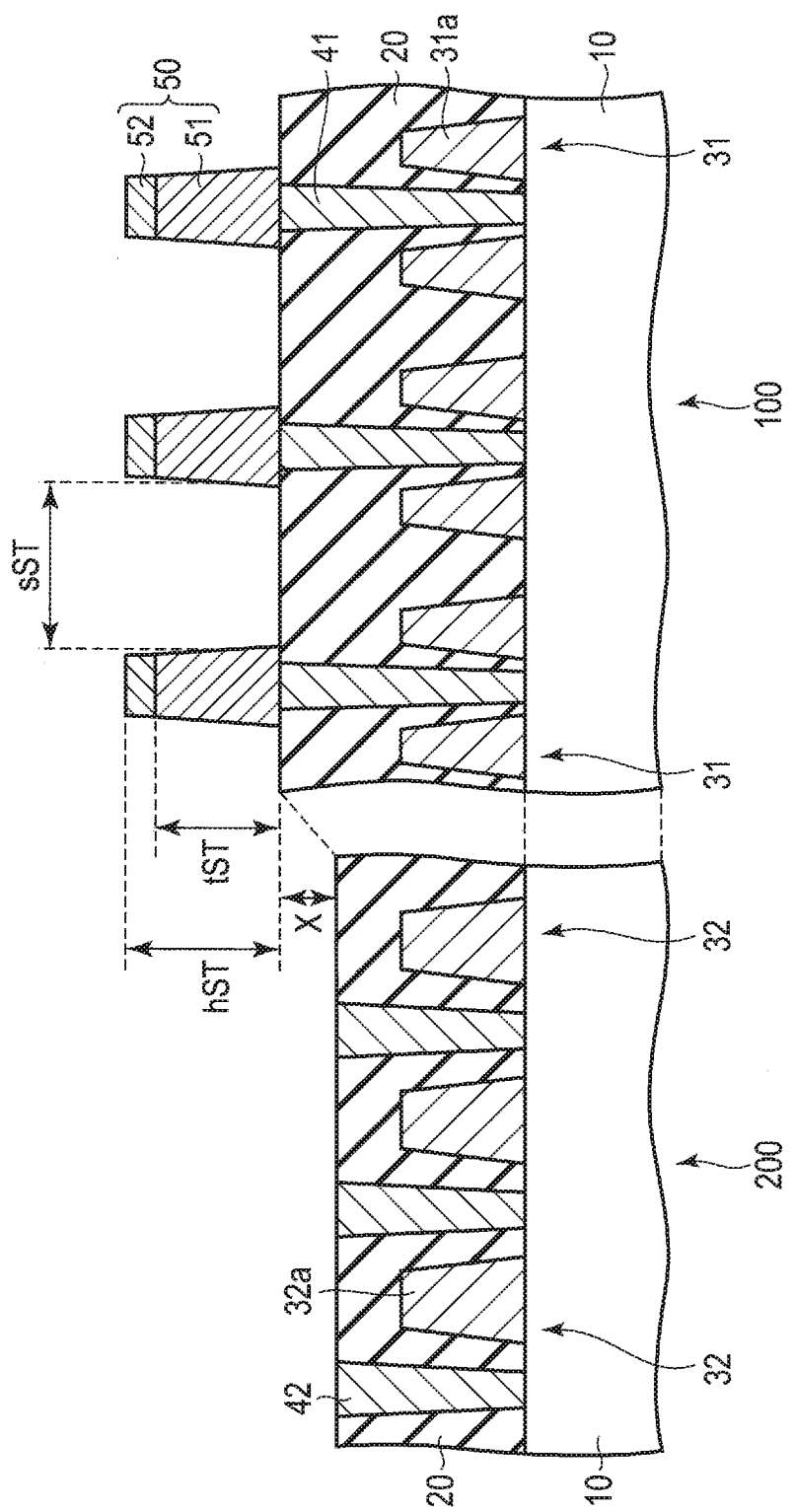
FIG. 6 is a schematic cross-sectional view showing yet another part of the process of manufacturing the magnetic memory device of the embodiment.

FIGS. 4, 5 and 6 are schematic sectional views showing a process of manufacturing the magnetic memory device of the embodiment.

First, as shown in FIG. 4, a film 51a for the magnetoresistive elements is stacked on a lower structure that includes the interlayer insulating film 20, the MOS transistors 31 and 32 and the conductive plugs 41 and 42. After that, a hard mask layer 52 of a certain pattern is formed on the stacked film 51a. The thickness of the interlayer insulating film 20 is t0, and the thickness of the film 51a is tST.

Next, as shown in FIG. 5, the stacked film 51a is etched, using the hard mask layer 52 as a mask. FIG. 5 shows a state assumed when the etching of the film 51a in the peripheral circuit area 200 has been just finished. The etching of the stacked film 51a is performed by IBE (ion beam etching) using an ion beam of a noble gas element, such as argon (Ar). This etching step will be described in detail.

When etching the stacked film 51a by IBE, an ion beam is obliquely applied to the stacked film 51a in order to prevent an etching product from being deposited on the side wall of the stacked film 51a. More specifically, the ion beam is applied to the stacked film 51a at 45° with respect to the main surface of the semiconductor substrate (semiconductor wafer), while rotating the semiconductor substrate.

However, if the space width between adjacent magnetoresistive elements is reduced in accordance with microfabrication of elements, the ion beam is cut by the pattern of the magnetoresistive elements, whereby the etching rate of the areas between the magnetoresistive elements is reduced. As a result, a difference may occur in etching rate between the memory cell array area and the peripheral circuit area. More specifically, the etching rate of the memory cell array area, in which the magnetoresistive elements are arranged in a matrix, is lower than that of the peripheral circuit area. As a result, as shown in FIG. 5, when etching of the stacked film 51a in the peripheral circuit area 200 has been finished, etching of the stacked film 51a in the memory cell array area 100 is not yet finished.

Assume here that the etching rate of the stacked film 51a in the peripheral circuit area 200 (i.e., the etching rate of IBE) is set to ERperi. Assume also that the start point of etching by IBE is set as an original (T=0), and that the end point of the etching of the stacked film 51a in the peripheral circuit area 200 is set as "T=T1." At this time, the following relationship is established:

$$T1 = tST/ERperi \quad (3)$$

If etching of the stacked film 51a by IBE is further continued, such a state as shown in FIG. 6 is obtained. FIG. 6 shows a state assumed when the etching of the stacked film 51a of the memory cell array area 100 has just finished.

As already mentioned, the etching rate of the peripheral circuit area 200 is higher than that of the memory cell array area 100. Therefore, when the etching of the stacked film 51a of the memory cell array area 100 has just finished, etching of the interlayer insulating film 20 has already advanced in the peripheral circuit area 200, thereby reducing the thickness of the interlayer insulating film 20.

Etching by IBE is physical etching using an ion beam of a rare gas element, such as argon (Ar), and differs from etching accompanied by chemical reaction, such as RIE (reactive ion etching). Therefore, the etching rate of IBE is substantially constant regardless of a material to be etched. Accordingly, in the peripheral circuit area 200, even after finishing the etching of the stacked film 51a, etching of, for example, the interlayer insulating film 20 is performed by the same etching rate as that of the stacked film 51a. Similarly, in the memory cell array area 100, the hard mask layer 52 is etched by the same etching rate as that of the stacked film 51a.

Assume here that the etching rate of the stacked film 51a of the memory cell array area 100 (i.e., the etching rate of IBE) is ERcell. Assume also that the time when the etching of the stacked film 51a of the memory cell array area 100 has just finished is "T=T2." At this time, the following relationship is established:

$$T2 = tST/ERcell \quad (4)$$

Therefore, assuming that the difference between the thickness of the interlayer insulating film 20 in the memory cell array area 100 and the thickness of the interlayer insulating film 20 in the peripheral circuit area 200 is X at time T2 when the etching of the stacked film 51a in the memory cell array area 100 has just finished, the following relationship is established from formulas (3) and (4):

$$\begin{aligned} X &= ERperi(T2 - T1) \\ &= ERperi(tST/ERcell - tST/ERperi) \\ &= tST(ERperi/ERcell - 1) \end{aligned} \quad (5)$$

As already mentioned, the etching rate of IBE is substantially constant regardless of a material to be etched. Therefore, the etching rate ERperi in the peripheral circuit area 200 is substantially constant. Since part of an ion beam interrupted by the pillar patterns of the stacked film 51a and the hard mask layer 52, the etching rate ERcell in the memory cell array area 100 becomes lower than the etching rate ERperi in the peripheral circuit area 200. Further, since the incident angle of the ion beam is constant (45°), it is considered that the ratio of the part of the ion beam interrupted by the pillar patterns is uniquely determined based on the ratio of the space width between the pillar patterns to the height of the pillar patterns. Accordingly, it is considered that the etching rate ERcell in the memory cell array area 100 is also uniquely determined by the ratio of the space width sST between the pillar patterns to the height hST of the pillar patterns. Moreover, assuming that the etching rate of the hard mask layer 52 is also the same as that of the stacked film 51a, the height hST of the pillar patterns can be maintained constant even after the etching by IBE advances. Therefore, it is considered that the ratio (ERperi/ERcell) of the etching rate ERperi in the peripheral circuit area 200 to the etching rate ERcell in the memory cell array area 100 is uniquely determined by the ratio (sST/hST) of the space width sST between the pillar patterns to the height hST of the pillar patterns.

Figure 7:
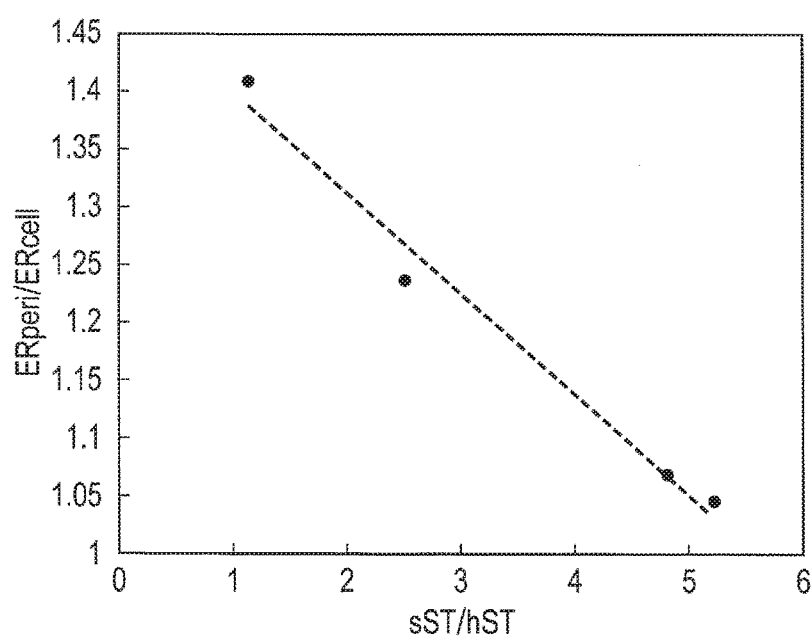
FIG. 7 is a graph obtained by fitting, using a linear function, a measurement result (experimental result) of the magnetic memory device of the embodiment.

FIG. 7 shows the relationship between the aforementioned ratio (sST/hST) and ratio (ERperi/ERcell), obtained experimentally. If the measurement result (experimental result) of FIG. 7 is fitted using a linear function, it is expressed as follows:

$$ERperi/ERcell = -0.086 * sST/hST + 1.48 \quad (6)$$

As is evident from the above description, the etching rate ERperi in the peripheral circuit area 200 is constant. Since the incident angle of the ion beam is constant (45°), the etching rate ERcell in the memory cell array area 100 is uniquely determined by the ratio (sST/hST) of the space width sST to the height hST. Therefore, the above formula (6) is established regardless of the element size or the material.

If the linear function (ERperi/ERcell) is assigned to formula (5), the following is established:

$$\begin{aligned}X &= tST(ERperi/ERcell - 1) \quad (7)\\ &= tST(-0.086 * sST/hST + 1.48 - 1)\\ &= tST * (0.48 - 0.086 * sST/hST)\end{aligned}$$

As already mentioned, the etching rate ERperi in the peripheral circuit area 200 is greater than the etching rate ERcell in the memory cell array area 100.

Accordingly, the value of the right-hand side of formula (7) is greater than zero, and the following relationship is established:

$$tST*(0.48-0.086*sST/hST)>0 \quad (8)$$

The following relationship is obtained from formula (8):

$$sST/hST<0.48/0.086 \leqq 5.58 \quad (9)$$

Accordingly, sST/hST must be less than 5.58.

Furthermore, if sST/hST becomes lower than 1.0, application of the ion beam to areas between the pillar patterns of the stacked film 51a and the hard mask layer 52 is completely interrupted by the pillar patterns. Therefore, it is preferable that sST/hST be not less than 1.0.

Formula (7) is established at time T2 when the etching of the stacked film 51a of the memory cell array area 100 has just finished. If etching by IBE is further continued from time T2, i.e., over etching is performed, the thickness of the interlayer insulating film 20 is reduced both in the memory cell array areas 100 and in the peripheral circuit areas 200. Since the etching rate of the peripheral circuit area 200 is higher than that of the memory cell array area 100, the difference X' between the thickness of the interlayer insulating film 20 of the peripheral circuit area 200 and the thickness of the interlayer insulating film 20 of the memory cell array area 100, which is obtained when over etching is performed, is greater than X obtained in formula (7). Therefore, the following is established:

$$X'>tST*(0.48-0.086*sST/hST) \quad (10)$$

If both the case of just etching and the case of over etching are included, the difference X" between the thickness of the interlayer insulating film 20 of the peripheral circuit area 200 and the thickness of the interlayer insulating film 20 of the memory cell array area 100 is expressed as follows:

$$X''\geqq tST*(0.48-0.086*sST/hST) \quad (11)$$

From formula (11), it is evident that formula (2) mentioned above is established.

A consideration will now be given to a minimum film thickness required for the interlayer insulating film 20. As already mentioned, the etching rate of the peripheral circuit area 200 is higher than that of the memory cell array area 100. Accordingly, if the interlayer insulating film 20 is too thin, the gate electrode 32a of the peripheral circuit area 200 may be exposed during etching of the interlayer insulating film 20. If the gate electrode 32a is exposed, short-circuiting (for example, contact of the gate electrode 32a and the conductive plug 72 in FIG. 1) may occur.

In order to prevent the above-described exposure of the gate electrode 32a, the thickness of the interlayer insulating film 20 of the peripheral circuit area 200 must be greater than the height hgate of the gate electrode 32a at least at time T2 where just etching is performed. In other words, the thickness t0 of the interlayer insulating film 20 before etching must be greater than (X+hgate). That is, the following relationship needs to be established:

$$t0>X+hgate \quad (12)$$

If formula (7) is assigned to formula (12), above-mentioned formula (1) is established.

Figure 10:
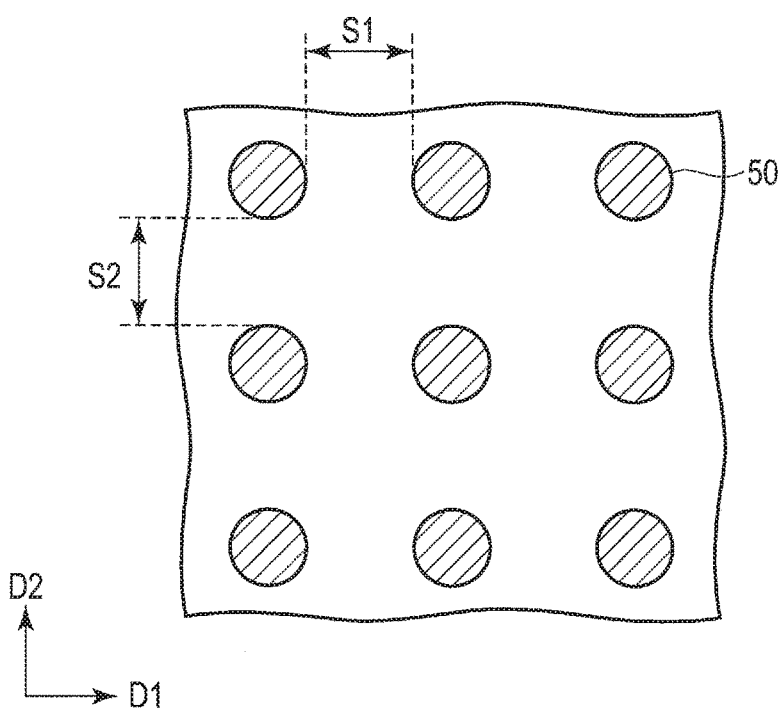
FIG. 10 is a schematic plan view showing yet another planar arrangement example of the stacked structure in the memory cell array area of the magnetic memory device of the embodiment.
Figure 8:
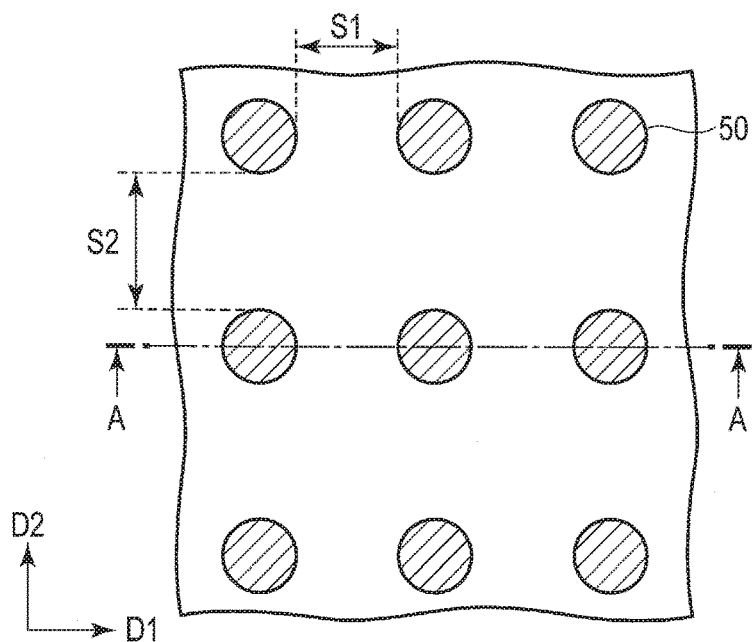
FIG. 8 is a schematic plan view showing a planar arrangement example of a stacked structure in the memory cell array area of the magnetic memory device of the embodiment.
Figure 9:
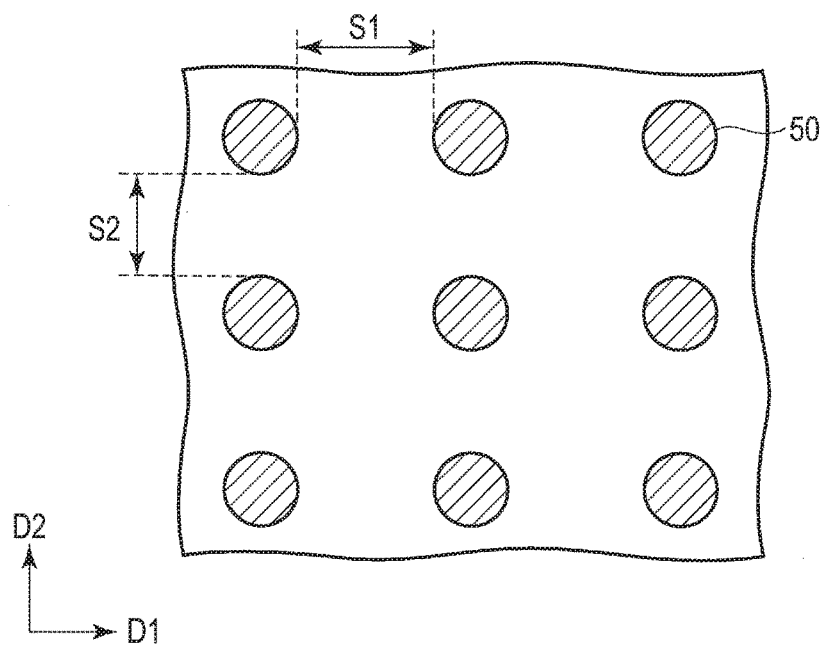
FIG. 9 is a schematic plan view showing another planar arrangement example of the stacked structure in the memory cell array area of the magnetic memory device of the embodiment.

FIGS. 8, 9 and 10 are schematic plan views showing planar arrangements of the stacked structures 50 for magnetoresistive elements in the memory cell array area 100.

As shown in FIGS. 8, 9 and 10, the stacked structures 50 are arranged in a matrix in a first direction D1 and a second direction D2 perpendicular to the first direction D1. For instance, a cross section taken along line A-A of FIG. 8 corresponds to the cross section of the memory cell array area 100 of FIG. 1.

If a first space width S1 between each pair of stacked structures 50 adjacent in the first direction D1 is smaller than a second space width S2 between each pair of stacked structures 50 adjacent in the second direction D2, as is shown in FIG. 8, the above-mentioned space width sST in each formula corresponds to the first space width S1. If the first space width S1 is greater than the second space width S2 as shown in FIG. 9, the above-mentioned space width sST in each formula corresponds to the second space width S2. If the first space width S1 is identical to the second space width S2 as shown in FIG. 10, the above-mentioned space width sST in each formula corresponds to either of the first and second space widths S1 and S2.

In addition, the space width sST is defined as a space width between the tunnel barrier layers (nonmagnetic layers) of stacked structures 50 adjacent in a predetermined direction. Also in the measurement data of FIG. 7, the space width sST is defined by the space width between such tunnel barrier layers.

As described above, in the embodiment, the thickness t0 of the interlayer insulating film 20 is defined by formula (1). Therefore, when forming the stacked structure 50 by IBE, the interlayer insulating film 20 can be made to an appropriate thickness even when the etching rate of the memory cell array area 100 becomes lower than that of the peripheral circuit area 200 in accordance with high integration of stacked structures 50. As a result, the gate electrode 32a of each MOS transistor 32 in the peripheral circuit area 200 can be prevented from being exposed, thereby providing a magnetic memory device (semiconductor integrated circuit device) excellent in reliability.

When the degree of integration of stacked structures (magnetoresistive elements) 50 is not high, or when the stacked structure 50 is formed by RIE, there is no particular difference in etching rate between the memory cell array area 100 and the peripheral circuit area 200, which is free from the problem that the gate electrode 32a of each MOS transistor 32 in the peripheral circuit area 200 is exposed. However, in the case where the degree of integration of stacked structures 50 is high, and the stacked structures 50 are formed by IBE, the above-mentioned problem can be reliably avoided by defining the thickness t0 of the interlayer insulating film 20 based on formula (1).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
a semiconductor region;
a first insulating film located in a memory cell array area and a peripheral circuit area, provided on the semiconductor region, and having a portion located in the memory cell array area and thicker than a portion located in the peripheral circuit area;
a plurality of conductive plugs located in the memory cell array area and provided in the first insulating film;
a plurality of stacked structures located in the memory cell array area, provided on the conductive plugs, and each having a plurality of layers including a magnetic layer;
a second insulating film provided on the first insulating film and covering the stacked structures; and
a plurality of transistors located in the peripheral circuit area, and each including a gate electrode provided on the semiconductor region and covered with the first insulating film,
wherein the following relationship is satisfied:

$$t0 > hgate + tST*(0.48 - 0.086*sST/hST)$$

where t0 is a thickness from a main surface of the semiconductor region to a lower surface of each of the stacked structures, hgate is a height of the gate electrode from the main surface of the semiconductor region, tST is a thickness from the lower surface of each of the stacked structures to a lower surface of an uppermost layer of each of the stacked structures, hST is a height from an interface between the first and second insulating films to an upper surface of the uppermost layer of each of the stacked structures, and sST is a space width between adjacent ones of the stacked structures adjacent in a predetermined direction.

2. The magnetic memory device of claim 1, wherein sST/hST is less than 5.58 and is not less than 1.0.

3. The magnetic memory device of claim 1, wherein $$t1M - t1P \geq tST*(0.48 - 0.086*sST/hST)$$

where t1M is a thickness of a particular portion of the first insulating film from the main surface of the semiconductor region in the memory cell array area, the particular portion of the first insulating film is located below an area between adjacent ones of the stacked structures, t1P is a thickness of the first insulating film from the main surface of the semiconductor region in the peripheral circuit area.

4. The magnetic memory device of claim 1, wherein the stacked structures are arranged in a first direction and a second direction perpendicular to the first direction.

5. The magnetic memory device of claim 4, wherein
when a first space width between adjacent ones of the stacked structures adjacent in the first direction is smaller than a second space width between adjacent ones of the stacked structures adjacent in the second direction, the space width sST corresponds to the first space width;
when the first space width is greater than the second space width, the space width sST corresponds to the second space width; and
when the first space width is equal to the second space width, the space width sST corresponds to either of the first and second space widths.

6. The magnetic memory device of claim 1, wherein each of the stacked structures includes a first magnetic layer having a variable magnetization direction, a second magnetic layer having a fixed magnetization direction, and a nonmagnetic layer provided between the first and second magnetic layers.

7. The magnetic memory device of claim 6, wherein the space width sST corresponds to a space width between nonmagnetic layers of adjacent ones of the stacked structures adjacent in the predetermined direction.

8. The magnetic memory device of claim 6, wherein each of the stacked structures has a resistance lower when the magnetization direction of the first magnetic layer is parallel with the magnetization direction of the second magnetic layer, than when the magnetization direction of the first magnetic layer is anti-parallel with the magnetization direction of the second magnetic layer.

9. The magnetic memory device of claim 1, wherein the uppermost layer of each of the stacked structures corresponds to a hard mask layer for IBE (ion beam etching).

10. The magnetic memory device of claim 1, wherein the peripheral circuit area is provided outside and adjacent to the memory cell array area.

11. The magnetic memory device of claim 1, wherein the first insulating film is continuously formed in the memory cell array area and the peripheral circuit area.

12. The magnetic memory device of claim 1, wherein the second insulating film is formed of a material different from a material of the first insulating film.

13. The magnetic memory device of claim 1, wherein the second insulating film includes a silicon nitride layer.

14. The magnetic memory device of claim 1, wherein the first insulating film includes a silicon oxide layer.

15. A magnetic memory device comprising:
a semiconductor region;
a first insulating film located in a memory cell array area and a peripheral circuit area, provided on the semiconductor region, and having a portion located in the memory cell array area and thicker than a portion located in the peripheral circuit area;

a plurality of conductive plugs located in the memory cell array area and provided in the first insulating film;

a plurality of stacked structures located in the memory cell array area, provided on the conductive plugs, and each having a plurality of layers including a magnetic layer;

a second insulating film provided on the first insulating film and covering the stacked structures; and a plurality of transistors located in the peripheral circuit area, and each including a gate electrode provided on the semiconductor region and covered with the first insulating film, wherein the following relationships are satisfied:

$$t1M-t1P \geq tST*(0.48-0.086*sST/hST)$$

where t1M is a thickness of a particular portion of the first insulating film from a main surface of the semiconductor region in the memory cell array area, the particular portion of the first insulating film is located below an area between adjacent ones of the stacked structures, t1P is a thickness of the first insulating film from the main surface of the semiconductor region in the peripheral circuit area, tST is a thickness from a lower surface of each of the stacked structures to a lower surface of an uppermost layer of each of the stacked structures, hST is a height from an interface between the first and second insulating films to an upper surface of the uppermost layer of each of the stacked structures, and sST is a space width between adjacent ones of the stacked structures adjacent in a predetermined direction.

16. The magnetic memory device of claim 15, wherein sST/hST is less than 5.58 and is not less than 1.0.

17. The magnetic memory device of claim 15, wherein the stacked structures are arranged in a first direction and a second direction perpendicular to the first direction.

18. The magnetic memory device of claim 17, wherein
when a first space width between adjacent ones of the stacked structures adjacent in the first direction is smaller than a second space width between adjacent ones of the stacked structures adjacent in the second direction, the space width sST corresponds to the first space width;
when the first space width is greater than the second space width, the space width sST corresponds to the second space width; and
when the first space width is equal to the second space width, the space width sST corresponds to either of the first and second space widths.

19. The magnetic memory device of claim 15, wherein each of the stacked structures includes a first magnetic layer having a variable magnetization direction, a second magnetic layer having a fixed magnetization direction, and a nonmagnetic layer provided between the first and second magnetic layers.

20. The magnetic memory device of claim 15, wherein the peripheral circuit area is provided outside and adjacent to the memory cell array area.

\* \* \* \* \*